United States Patent
Ball et al.

(10) Patent No.: US 7,274,749 B2
(45) Date of Patent: Sep. 25, 2007

(54) METHOD AND APPARATUS FOR THE LINEARIZATION OF A RADIO FREQUENCY HIGH-POWER AMPLIFIER

(75) Inventors: Carsten Ball, Rheinzabern (DE); Gerrit Buhe, Delbrueck (DE)

(73) Assignee: Siemens AG, Munich (DE)

( * ) Notice: Subject to any disclaimer, the term of this patent is extended or adjusted under 35 U.S.C. 154(b) by 835 days.

(21) Appl. No.: 10/181,196

(22) PCT Filed: Jan. 9, 2001

(86) PCT No.: PCT/DE01/00050

§ 371 (c)(1),
(2), (4) Date: Oct. 30, 2002

(87) PCT Pub. No.: WO01/52405

PCT Pub. Date: Jul. 19, 2001

(65) Prior Publication Data

US 2003/0076896 A1    Apr. 24, 2003

(30) Foreign Application Priority Data

Jan. 13, 2000  (DE) ............................. 100 01 151

(51) Int. Cl.
*H04K 1/02*  (2006.01)
(52) U.S. Cl. ...................................... 375/297
(58) Field of Classification Search ................. 375/297
See application file for complete search history.

(56) References Cited

U.S. PATENT DOCUMENTS

| | | | | |
|---|---|---|---|---|
| 5,077,619 A | * | 12/1991 | Toms | ........................ 398/193 |
| 5,293,457 A | * | 3/1994 | Arima et al. | ................... 706/34 |
| 5,295,197 A | * | 3/1994 | Takenaga et al. | ............ 382/158 |
| 6,108,385 A | * | 8/2000 | Worley, III | .................. 375/296 |
| 6,236,837 B1 | * | 5/2001 | Midya | ........................ 455/63.1 |

(Continued)

FOREIGN PATENT DOCUMENTS

EP    0967717 A2    12/1999

OTHER PUBLICATIONS

Watkins et al, "Neural Network based adaptive predisotrtion for the linearization of nonlinear RF amplifiers" 1995, IEEE 0-7803-2489-7/95, p. 145-149.*

(Continued)

*Primary Examiner*—Khai Tran

(57) ABSTRACT

The invention relates to a method for the linearization of a high-frequency high-capacity amplifier by means of adaptive digital predistortion of the input signals of the amplifier (5) by determining correctional values that are approximated from DESIRED sender signals detected at the amplifier input and ACTUAL sender signals detected at the amplifier output. To this end, I/Q data continuously derived from the DESIRED sender signals at the digital base band modulator (1) and I/Q data derived by a measuring unit (4) at the amplifier output from the ACTUAL sender signals are fed to a neuronal network for evaluation and for the calculation of correctional values. The correctional values produced are returned to the digital base band modulator (1) and the data flow flowing from the digital base band modulator (1) to the amplifier input is predistorted with the correctional values produced in the neuronal network. The device for carrying out the method for the linearization of a high-frequency high-capacity amplifier by means of adaptive digital predistortion comprises a digital base band modulator (1) that is mounted upstream of a D/A converter (8), a HF modulator (9) and the HF high-capacity amplifier (5). A measuring device (4) is linked with the neuronal network at the output of the HF amplifier (5) via a data link (6) so as to detect the I/Q data and the digital base band modulator (1) is linked with the neuronal network via an I/Q data link (3). A correctional data line (7) links the neuronal network (2) with the digital base band modulator (1).

9 Claims, 3 Drawing Sheets

U.S. PATENT DOCUMENTS 6,281,936 B1* 8/2001 Twitchell et al. ............ 348/470
6,625,227 B1* 9/2003 Shull et al. ................. 375/295

OTHER PUBLICATIONS

Murillo-Fuentes et al, "Applying GCMAC to predistortion in GSM base stations" 0-7803-5041-3/99, 1999 IEEE, p. 2575-2578.*

A. Mansell et al., "Adaptive digital predistortion linearisation", Centre for Communications Research, U. of Bristol.

N. Benvenuto et al., "A neural network approach to data predistortion with memory in digital radio sistems", IEEE, 0-7803-0950-2/93.

N. Benvenuto et al., Generalized backpropagation algorithm for training a data predistorter with memory in radio systems, Electronics Letters, vol. 32, No. 20, Sep. 1993.

* cited by examiner

METHOD AND APPARATUS FOR THE LINEARIZATION OF A RADIO FREQUENCY HIGH-POWER AMPLIFIER

CLAIM FOR PRIORITY

This application is a national stage of PCT/DE01/00050 filed 9 Jan. 2001, which claims priority to German application 10001151.9 filed 13 Jan. 2000.

TECHNICAL FIELD OF THE INVENTION

The invention relates to a method and an apparatus for linearization of a radio frequency high-power amplifier, in particular for mobile radio base stations.

BACKGROUND OF THE INVENTION

RF high-power amplifiers, which are used in mobile radio base stations, for example, have a characteristic which is curved and thus highly non-linear in the region of high output power levels close to the 1 dB compression point. As a result, signals with large amplitudes are distorted and/or chopped (AM/AM conversion). Furthermore, the phase of the emitted signal is also shifted (AM/PM conversion). In order to avoid drastic broadening of the transmission spectrum, and hence adjacent channel interference, as well as a deterioration in the modulation accuracy, and the considerable increase in the bit error rate associated therewith, only the linear part of the amplifier characteristic is typically used. However, this is worthwhile only for low power levels. In the case of RF amplifiers for base stations for second and third generation mobile radio, if there is a restriction to the linear part of the amplifier characteristic, it would be necessary to use amplifiers with two to ten times the power, as a result of which the production costs for the equipment would be increased enormously. Hence, the efficiency levels of the amplifiers would be considerably reduced. Furthermore—depending on the semiconductors used—the intermodulation characteristics would become worse.

In order to avoid this, the nonlinear characteristic can be compensated for by suitable distortion of the input signal. This is commonly referred to as pre-distortion and, until now, has been used primarily at the analog level and in the small signal area, although it has also been used in digital baseband. This is generally done rigidly, for example by using diode characteristics.

A neural network which is in the form of a "perceptron" and which is connected upstream of a power amplifier in the signal path is known from "A Neural Network Approach To Data Predistortion With Memory In Digital Radio Systems", by Benvenuto et al., Proceedings Of The International Conference On Communications (ICC.), Geneva, May 23-26, 1993 New York, IEEE, US. Coefficients for an FIR filter for pre-distortion are determined by means of the perceptron.

Furthermore, adaptive pre-distortion methods are also known, for example from the article "Adaptive Digital Pre-distortion Linearization" in "Microwaves & RF" 1996 pages 270 to 275, in which the ACTUAL transmission signal at the amplifier output is measured in order to compensate for the actual non-linearity of the amplifier characteristic. This is compared with the NOMINAL transmission signal at the amplifier input. Using known mathematical methods (for example by means of regression, error polynomial, etc.), the required pre-distortion of the input signal can then be determined from the difference.

These known methods, and the apparatuses used to carry them out, have the disadvantage that the required function, which is aimed at the linearization of the amplifier characteristic, cannot be defined flexibly, but only as an error polynomial that is to be minimized.

Furthermore, it is impossible to include not only the optimum approximation of the amplifier characteristic but also the transmission spectrum in the required function.

Finally, it is impossible to approximate the nonlinear characteristic of the amplifier, and/or its inverse characteristic, optimally, when the measurement signal to be evaluated is subject to severe noise.

SUMMARY OF THE INVENTION

In one embodiment of the invention, there is a method and apparatus for linearization of a radio frequency high-power amplifier, which overcomes the disadvantages mentioned above, and by means of which it is possible to define the required function flexibly as well as in the case of a measurement signal which is subject to severe noise, and at the same time to optimize this on the basis of a number of different criteria.

BRIEF DESCRIPTION OF THE DRAWINGS

The invention will be explained in more detail in the following text with reference to a preferred exemplary embodiment and in conjunction with the drawings, in which.

DETAILED DESCRIPTION OF THE PREFERRED EMBODIMENTS

Figure 1:
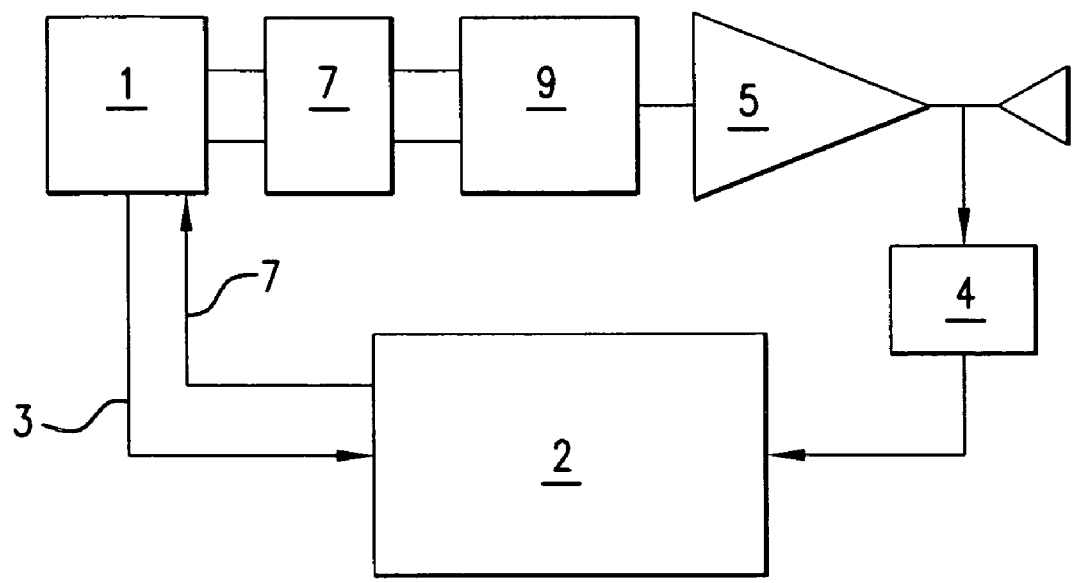
FIG. 1 shows an exemplary structure of an apparatus according to the invention.

FIG. 1 shows an exemplary design of a pre-distortion apparatus according to the invention, with a neural network 2, as can be used, by way of example, in a base station output stage of a mobile radio station. The input values that are used are the original I/Q data from the digital baseband modulator 1, which is supplied to the neural network 2 via an I/Q data line 3, as well as the I/Q data which is determined at the output of the RF high-power amplifier 5 by means of a measurement device 4 and is supplied to the neural network 2 via a data line 6.

The neural network 2 uses the I/Q measurement data supplied from the measurement device 4 at the amplifier output to approximate the actual amplifier characteristic and/or its inverse characteristic, and forms correction values while at the same time evaluating the I/Q data arriving from the digital baseband modulator 1. These correction values are supplied via the output line 7 to the digital baseband modulator 1, in order to pre-distort the data stream of the digital baseband modulator 1 with these correction values before this data stream is supplied via the D/A converter 8 and the RF modulator 9 to the RF high-power amplifier 5, and in order in this way to compensate for the non-linearity of the characteristic of the RF high-power amplifier 5.

Figure 2:
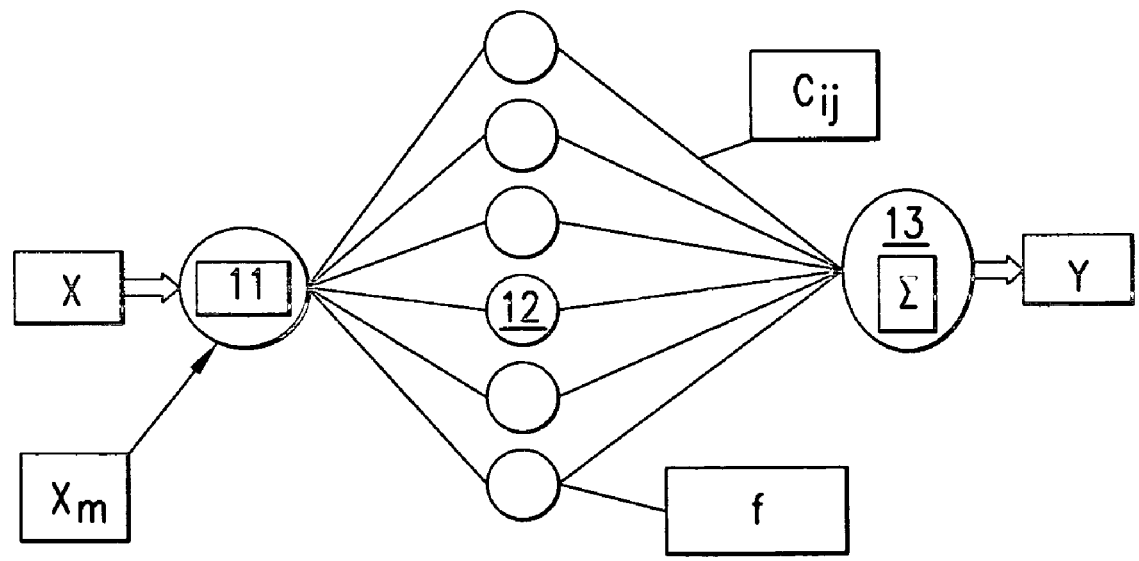
FIG. 2 shows an exemplary structure of the neural network implemented according to the invention.

FIG. 2 shows an exemplary structure of the neural network. This comprises an input layer 11, an intermediate layer 12 and an output layer 13, which are networked to one another by means of weighted edges. The neurons in the input layer 11 are provided with a bias function $x_m$, the neurons in the intermediate layer provide different exponential, sigmoid and polynomial functions f, and the neurons in the output layer have a sum function $\Sigma$.

The weight factors $c_{ij}$ which are allocated randomly at the start, and the bias inputs $x_m$ of the neural network are optimally set iteratively by means of the back propagation algorithm. In the process, the set of signal vectors $X=\{x_1, x_2, \ldots x_n\}$ which each comprise a magnitude and phase are fed in successively as an input, and the respective instantaneous output of the network $Y=\{y_1, y_2, \ldots y_n\}$ is calculated. The required function E to be minimized for the network is calculated on the basis of Y, for example:

$$E = k_1 * \text{sum}(y_i - y_{i\ nominal})^2 + k_2 * (\text{spectrum} - \text{spectrum}_{nominal})^2.$$

The constants $k_1$ and $k_2$ are undefined weight factors, and "spectrum" is a figure obtained from a Fast Fourier Transformation (FFT) of the signal vectors. $y_{i\ nominal}$ are the desired output values of the amplifier, i.e. in general a constant times $x_i$. The weight factors and bias inputs of the network are then readjusted using a gradient descent method:

$$\Delta c_{ij} = -\gamma dE/dc_{ij}$$

$$\Delta x_m = -\gamma * dE/dx_m.$$

Figure 3:
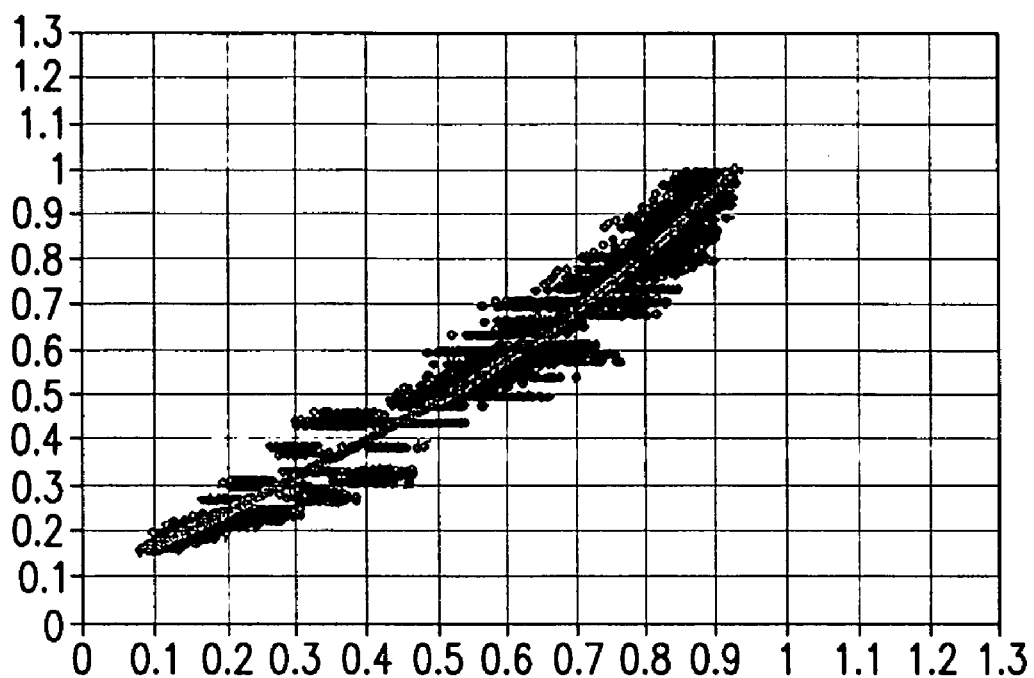
FIG. 3 shows an inverse amplifier characteristic approximated according to the invention by means of a neural network as shown in FIG. 2.

FIG. 3 shows how the neural network 2 has learned the inverse amplifier characteristic from measurement data that is subject to severe noise at the RF amplifier output. As an alternative—as illustrated in FIG. 4—the amplifier characteristic may itself also be approximated.

Figure 4:
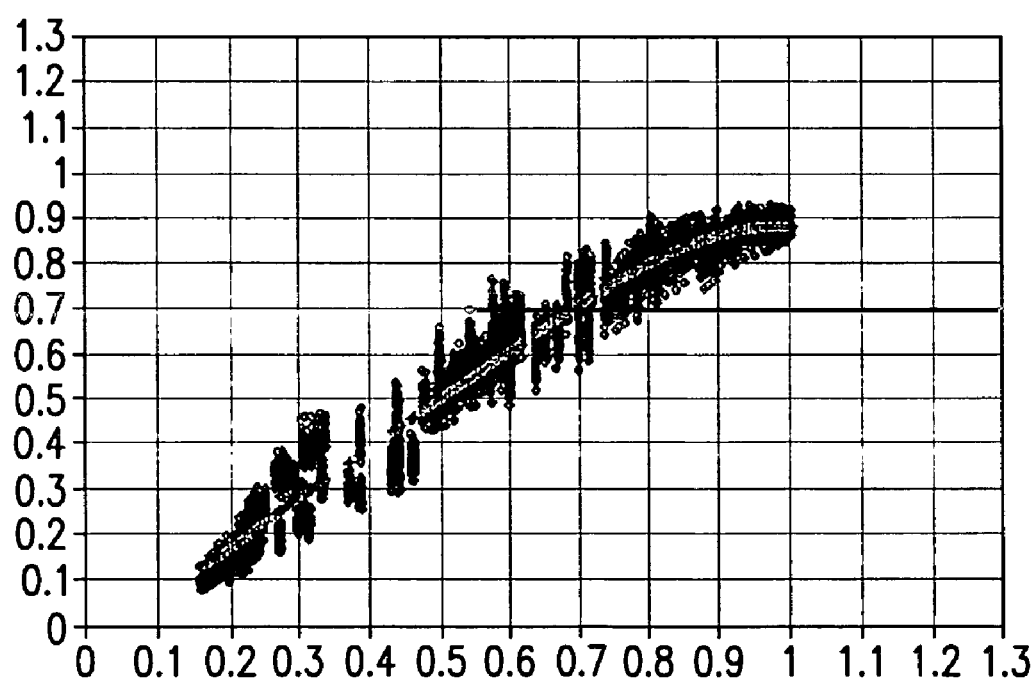
FIG. 4 shows an approximation according to the invention of the amplifier characteristic.
Figure 5:
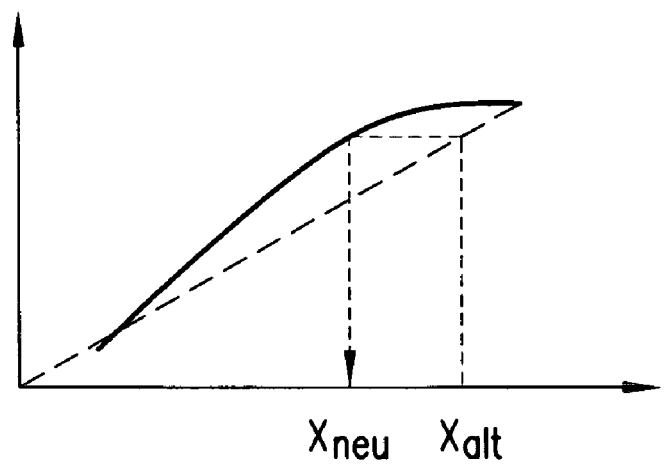
FIG. 5 shows, by way of example, the distortion of the baseband vectors X to be carried out on the basis of the approximated amplifier characteristic.

The mapping function $X_{old} \rightarrow X_{new}$ can now be determined from the curved characteristic shown in FIG. 3 or FIG. 4 and in comparison with an ideal linear function according to FIG. 5 (shown here only for the amplitudes), in order to distort the data stream from the digital baseband modulator 1 in a suitable manner and to obtain the desired linearized amplitudes and phase values at the output of the RF amplifier 5.

Figure 6:
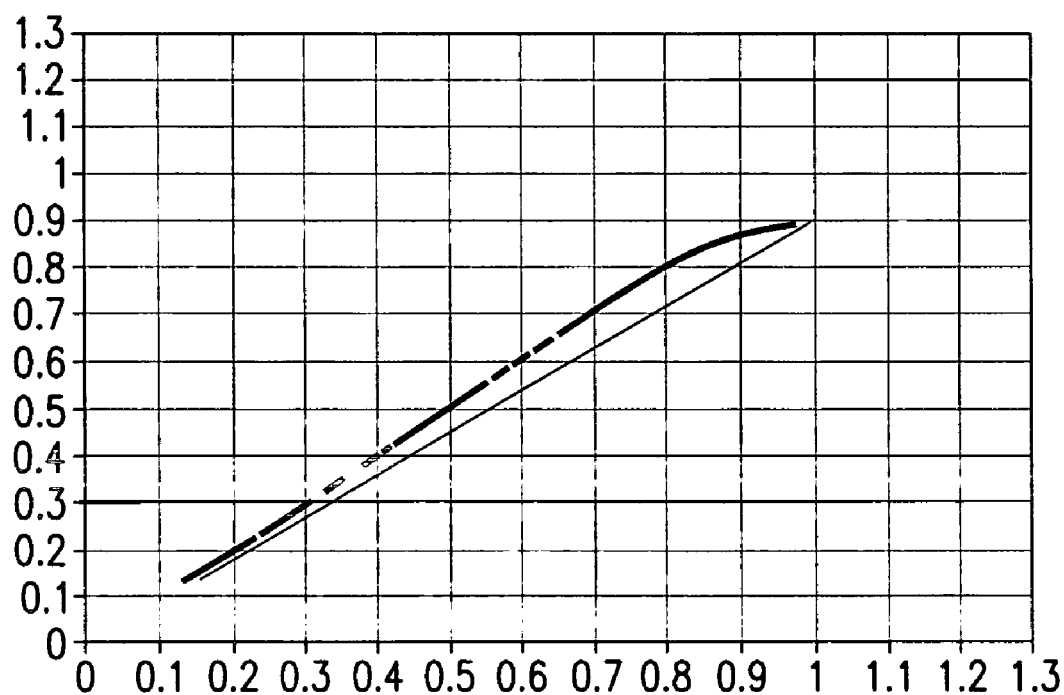
FIG. 6 shows the linearized amplifier characteristic after the predistortion.

FIG. 6 shows the effects achieved by the pre-distortion. Both the old signal vectors $X_{old}$ and the new distorted signal vectors $X_{new}$ have been fed into the trained neural network 2. As expected, this results in the nonlinear amplifier characteristic for the values $X_{old}$, and in the linear characteristic for $X_{new}$.

A neural network such as this may also be repeatedly fed and trained with newly measured vectors during operation. This then also makes it possible to provide adaptation and to compensate for drifts of the amplifier with time and temperature.

The invention has the advantage that the required function to be optimized can be defined flexibly. The required function may comprise any desired number of individual functions with any desired weights. Furthermore, the required function may be defined differently for different sub-elements of the characteristic of the amplifier.

The neural network allows the nonlinear characteristic of the amplifier and/or its inverse characteristic to be determined, even when the measurement signal is subject to severe noise.

The calculation accuracy is as good as desired, and depends on the network size and the computation time.

The invention claimed is:

1. A method for linearization of a radio frequency high-power amplifier, comprising:
   providing adaptive digital pre-distortion of the input signals of the amplifier by determination of correction values, which are approximated from NOMINAL transmission signals and which are detected at the amplifier input;
   detecting ACTUAL transmission signals at the amplifier output; and
   deriving continuously I/Q data from the NOMINAL transmission signals in a digital baseband modulator, and deriving I/Q data from the ACTUAL transmission signals at the amplifier output to a measurement device;
   supplying both of the I/Q data to a neural network for evaluation and for forming correction values; and
   feeding the correction values which are formed back to the digital baseband modulator, wherein a data stream which emerges from the digital baseband modulator to the amplifier input is pre-distorted with the correction values which are formed in the neural network, wherein edge weights of the neural network are changed in steps for coupling between neurons during the evaluation of the I/Q data, which is derived from the ACTUAL transmission signals at the output of the RF amplifier until the characteristic of the RF amplifier is optimally approximated.

2. The method as claimed in claim 1, wherein a required function is defined from any desired number of individual functions having any desired weights.

3. The method as claimed in claim 2, wherein the transmission spectrum is included in the definition of the required function.

4. An apparatus for linearization of a radio frequency high-power amplifier by adaptive digital pre-distortion, comprising:
   a digital baseband modulator which is followed by a D/A converter, an RF modulator and the RF high-power amplifier;
   a measurement device for determination of I/Q data at the output of the RF amplifier is connected to a neural network via a data line;
   an I/Q data line is connected from the digital baseband modulator to the neural network; and
   a correction data line is fed back from the neural network to the digital baseband modulator, wherein edge weights of the neural network are changed in steps for coupling between neurons during the evaluation of the I/Q data, which is derived from the ACTUAL transmission signals at the output of the RF amplifier until the characteristic of the RF amplifier is optimally approximated.

5. The apparatus as claimed in claim 4, wherein the neural network has variable bias inputs.

6. The apparatus as claimed in claim 4, wherein neurons have desired digital and analog characteristics.

7. The apparatus as claimed in claim 4, wherein the neural network is formed by software from a signal processor.

8. The apparatus as claimed in claim 5, wherein the neural network is formed by software from a signal processor.

9. The apparatus as claimed in claim 6, wherein the neural network is formed by software from a signal processor.

* * * * *